(12) United States Patent
Watanabe et al.

(10) Patent No.: US 8,299,810 B2
(45) Date of Patent: Oct. 30, 2012

(54) TEST APPARATUS AND ELECTRONIC DEVICE

(75) Inventors: Daisuke Watanabe, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/512,933

(22) Filed: Jul. 30, 2009

(65) Prior Publication Data
US 2010/0026329 A1 Feb. 4, 2010

Related U.S. Application Data

(63) Continuation of application No. PCT/JP2008/055321, filed on Mar. 21, 2008.

(30) Foreign Application Priority Data

Mar. 29, 2007 (JP) ................................. 2007-089691

(51) Int. Cl.
*G01R 31/00* (2006.01)
(52) U.S. Cl. .............................. 324/755.01; 324/756.04
(58) Field of Classification Search .................. None
See application file for complete search history.

(56) References Cited

U.S. PATENT DOCUMENTS

| 5,701,306 | A | 12/1997 | Arai |
| 5,936,448 | A | 8/1999 | Ohie et al. |
| 6,917,215 | B2 * | 7/2005 | Ichikawa ..................... 324/765 |
| 7,034,562 | B2 * | 4/2006 | Kimura ..................... 324/764.01 |
| 7,098,682 | B2 * | 8/2006 | Sasaki ........................ 324/750.3 |
| 7,372,251 | B2 * | 5/2008 | Ichikawa ................... 324/158.1 |
| 7,546,504 | B2 * | 6/2009 | Riley et al. .................... 714/729 |
| 2002/0184583 | A1 * | 12/2002 | Hikone et al. ................ 714/726 |
| 2004/0044491 | A1 * | 3/2004 | Yonaga et al. ................ 702/118 |
| 2005/0077905 | A1 | 4/2005 | Sasaki |
| 2005/0258855 | A1 * | 11/2005 | Kimura ........................ 324/765 |
| 2008/0052579 | A1 * | 2/2008 | Riley et al. .................... 714/731 |
| 2010/0007366 | A1 * | 1/2010 | Watanabe et al. ............. 324/763 |

FOREIGN PATENT DOCUMENTS

| CN | 1599869 A | 3/2005 |
| JP | H08-62298 A | 3/1996 |
| JP | 10-111343 A | 4/1998 |
| JP | 2001-222897 A | 8/2001 |

(Continued)

OTHER PUBLICATIONS

International Search Report (ISR) issued in PCT/JP2008/055321 (parent application) mailed on Jun. 2008 for Examiner consideration, citing US5936448, US20040044491, US20020184583, US20050258855, Foreign Patent JP10-111343, JP2004-093421, JP2002-357642, WO2005/111639 and JP2001-222897.

(Continued)

*Primary Examiner* — Jermele M Hollington
(74) *Attorney, Agent, or Firm* — Chen Yoshimura LLP

(57) ABSTRACT

Provided is a test apparatus that tests a device under test including an external interface circuit that transfers signals between an internal circuit inside a device and the outside of the device, the test apparatus comprising a pattern generating section that inputs, to the external interface circuit, a test pattern for testing the external interface circuit; an interface control section that causes the external interface circuit to loop back and output the test pattern; and an interface judging section that judges acceptability of the external interface circuit based on the test pattern looped back and output by the external interface circuit.

14 Claims, 7 Drawing Sheets

FOREIGN PATENT DOCUMENTS

| | | |
|---|---|---|
| JP | 2002-357642 A | 12/2002 |
| JP | 2004-093421 A | 3/2004 |
| WO | 2005/111639 A1 | 11/2005 |

OTHER PUBLICATIONS

Written Opinion (PCT/ISA/237) issued in PCT/JP2008/055321 (parent application) mailed on Jun. 2008.

Chinese Office Action in a counterpart application No. 200880010198.4, dated Jul. 20, 2011, citing Foreign Patent document No. 1 and US 2004/0044491 and WO 2005/111639.

Chinese Office Action dated Feb. 13, 2012 in a counterpart Chinese patent application No. 200880010198.4.

Korean Office Action in a counterpart, dated Nov. 28, 2011, application No. 10-2009-7016918.

Taiwanese Office Action in a counterpart Taiwanese patent application No. 097111564, dated Apr. 23, 2012.

Chinese Office Action in a counterpart Chinese patent application No. 200880010198.4, dated Aug. 3, 2012.

Japanese Office Action dated Aug. 28, 2012, in a counterpart Japanese patent application No. 2009-509082.

* cited by examiner

TEST APPARATUS AND ELECTRONIC DEVICE

CROSS REFERENCE TO RELATED APPLICATION

This is a continuation application of PCT/JP2008/055321 filed on Mar. 21, 2008 which claims priority from a Japanese Patent Application No. 2007-089691 filed on Mar. 29, 2007, the contents of which are incorporated herein by reference.

BACKGROUND

1. Technical Field

The present invention relates to a test apparatus and an electronic device. In particular, the present invention relates to an electronic device provided with an interface circuit that operates at high speed, and to a test apparatus that tests this electronic device.

2. Related Art

One test for a device such as a semiconductor circuit involves using a test signal having a frequency corresponding to the operational speed of the electronic device. In this case, the test apparatus for the electronic device (i) inputs, to the electronic device, a test pattern having a frequency corresponding to the operational speed of the electronic device, (ii) detects a logic value pattern of an output signal from the electronic device with a speed according to the frequency of this output signal, and (iii) compares this logic value pattern to an expected value pattern.

The test apparatus performing such a test may be provided with a pattern generator, a timing generator, a waveform shaper, a driver, a comparator, and a logical comparator, as shown in, for example, Japanese Patent Application Publication No. 2001-222897. The pattern generator generates a logic value pattern for the test pattern. The timing generator generates timing information of the logic value pattern. The waveform shaper and the driver generate the test signal to be input to the electronic device, based on the logic value pattern and the timing information.

The timing generator generates a timing signal that determines the bit rate of the test pattern, for example. The waveform shaper generates a test pattern in which the logic value transitions at the determined bit rate, based on the logic value pattern generated by the pattern generator. The driver outputs a voltage according to the logic value of the test pattern generated by the waveform shaper. An algorithm pattern generator (ALPG) may be used as the pattern generator to generate a test pattern having the desired logic value pattern.

An interface circuit of the electronic device receives the test signal from the test apparatus. The interface circuit inputs the test signal to an internal circuit of the electronic device, and the output signal of the internal circuit is supplied to the test apparatus.

The comparator of the test apparatus detects the logic value pattern of the output signal received from the interface circuit. The logical comparator detects whether the logic value pattern detected by the comparator matches a prescribed expected value pattern. In this way, the test apparatus can determine whether the interface circuit and the internal circuit of the electronic device are operating correctly.

In recent years, electronic devices have come to operate at much higher speeds. When testing high-speed electronic devices at the actual operation speed, a high-speed pattern generator is often used. For example, when testing an electronic device with an actual operation speed in the GHz range, a pattern generator that also operates in the GHz range is used.

However, it is difficult for the pattern generator used in conventional test apparatuses, such as the algorithm pattern generator, to operate at a high frequency in the GHz range.

A technique is considered that involves providing a plurality of pattern generators and multiplexing the output of the pattern generators to generate a high-frequency test pattern. With this technique, however, the circuit size of the test apparatus becomes undesirably large.

SUMMARY

Therefore, it is an object of an aspect of the innovations herein to provide a test apparatus and an electronic device, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test including an external interface circuit that transfers signals between an internal circuit inside a device and the outside of the device, the test apparatus comprising a pattern generating section that inputs, to the external interface circuit, a test pattern for testing the external interface circuit; an interface control section that causes the external interface circuit to loop back and output the test pattern; and an interface judging section that judges acceptability of the external interface circuit based on the test pattern looped back and output by the external interface circuit.

According to a second aspect related to the innovations herein, one exemplary electronic device may comprise an internal circuit; an external interface circuit that includes a plurality of I/O pins and that transfers signals between the internal circuit and the outside of the device; and a switching section that that switches whether each I/O pin is connected to the internal circuit or to another I/O pin.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
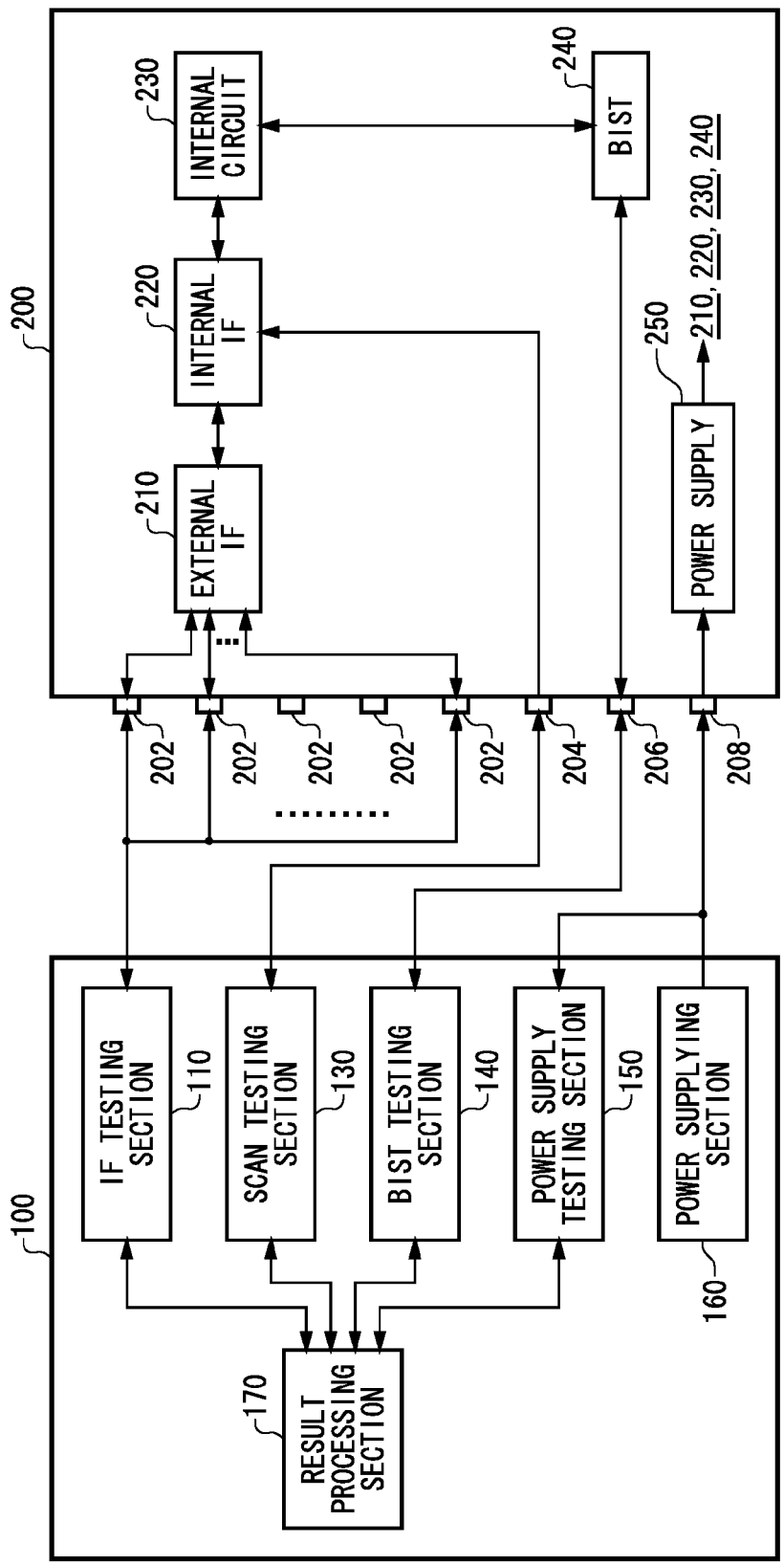
FIG. 1 shows an exemplary configuration of a test apparatus 100 according to an embodiment of the present invention.

FIG. 1 shows an exemplary configuration of a test apparatus 100 according to an embodiment of the present invention. The test apparatus 100 of the present embodiment tests a device under test 200, such as a semiconductor circuit. The test apparatus 100 disconnects an external interface circuit 210 of the device under test 200 from an internal circuit 230 when testing, in order to generate a simple test pattern for testing the external interface circuit 210. The testing of the internal circuit 230 involves using an internal self-test circuit 240 provided in the device under test 200. In this way, the test apparatus 100 can test the high-speed device under test 200 without generating a test pattern having a complex logic value pattern. Therefore, the test apparatus 100 can be realized at a low cost.

The device under test 200 includes the external interface circuit 210, an internal interface circuit 220, the internal circuit 230, the internal self-test circuit (BIST) 240, and a power supply 250. FIG. 1 shows I/O pins 202, a scan pin 204, a BIST pin 206, and a power supply pin 208 as being separate from the external interface circuit 210, but the I/O pins 202, the scan pin 204, the BIST pin 206, and the power supply pin 208 may be included in the external interface circuit 210.

The external interface circuit 210 is provided between the internal interface circuit 220 of the device under test 200 and the outside of the device, and operates to transfer signals. For example, the external interface circuit 210 receives a signal from the outside at an I/O pin 202 and inputs this signal to the internal circuit 230 via the internal interface circuit 220. As another example, the external interface circuit 210 may receive an output signal from the internal circuit 230 via the internal interface circuit 220, and output this signal to the outside via an I/O pin 202.

The internal circuit 230 may be a digital circuit, an analog circuit, or a combination of analog and digital circuits, and operates according to a signal input thereto. The internal circuit 230 may output, to the internal interface circuit 220, a signal corresponding to the signal received from the internal interface circuit 220. The internal circuit 230 may include a memory circuit that stores a data signal received from the internal interface circuit 220. In this case, the internal circuit 230 may output the stored data to the internal interface circuit 220, according to an access command.

The internal interface circuit 220 transfers signals between the external interface circuit 210 and the internal circuit 230. For example, if a memory cell is included in the internal circuit 230, the internal interface circuit 220 receives from the external interface circuit 210 a data writing command, the data to be written, and an address to be written to, and then writes this data onto the designated address in the internal circuit 230. As another example, the internal interface circuit 220 may receive from the external interface circuit 210 a data reading command and an address from which to read data, and may then read the data stored in the designated address of the internal circuit 230 and output this data to the external interface circuit 210.

The internal interface circuit 220 may include flip-flops in each transmission line providing a connection between one of the plurality of I/O pins 202 and the internal circuit 230. Each flip-flop holds the logic value of the signal transmitted on the corresponding signal line. These flip-flops may be connected in cascade in a scan path differing from the signal lines connecting the I/O pins 202 to the internal circuit 230. This scan path is connected to the scan pin 204.

The internal self-test circuit 240 tests the internal circuit 230. The internal self-test circuit 240 may test the internal circuit 230 according to a control signal supplied from the BIST pin 206. The internal self-test circuit 240 may generate the test signal to have a predetermined logic value pattern, and may supply the test signal to the internal circuit 230. The internal self-test circuit 240 may judge the acceptability of the internal circuit 230 by comparing the logic value pattern of the signal output by the internal circuit 230 to a predetermined logic value pattern.

The internal self-test circuit 240 may store a prescribed logic value in a memory cell of the internal circuit 230, and may read this logic value. At this time, the internal self-test circuit 240 may judge the acceptability of the internal circuit 230 based on whether the written logic value matches the read logic value. The internal self-test circuit 240 may send notification concerning this judgment result by the internal circuit 230 to the outside via the BIST pin 206.

The function of the internal self-test circuit 240 is not limited to the functions described above. The internal self-test circuit 240 may be a so-called BIST (Built In Self Test) circuit that is commonly used in the field.

The power supply 250 receives supply power from the outside via the power supply pin 208. The power supply 250 may provide the supply power to the external interface circuit 210, the internal interface circuit 220, the internal circuit 230, and the internal self-test circuit 240.

The test apparatus 100 is provided with an interface testing section 110, a BIST testing section 140, a scan testing section 130, a power supply testing section 150, a power supplying section 160, and a result processing section 170. The interface testing section 110 tests the external interface circuit 210.

The interface testing section 110 may input a test pattern having a prescribed logic value pattern to the I/O pins. The interface testing section 110 may cause the external interface circuit 210 to loop back and output the test pattern, and may then receive the looped test pattern from the I/O pins 202. The interface testing section 110 may judge the acceptability of the external interface circuit 210 based on whether the logic value pattern of the received test pattern matches the prescribed expected value pattern.

The interface testing section 110 may generate the test pattern to have a frequency that is substantially equal to the operational frequency of the device under test 200. For example, the interface testing section 110 may generate the test pattern with a frequency in the GHz range. Since the interface testing section 110 generates a high frequency test pattern in this way, the interface testing section 110 is desirably able to operate at high-speed.

Here, the interface testing section 110 does not test the internal circuit 230, and so there is no need to generate a test pattern having a variety of logic value patterns. For example, the interface testing section 110 may generate the test pattern to be a pseudorandom pattern, as described further below. In this case, the interface testing section can generate a test pattern with a frequency higher than that of a test pattern that can be generated by an algorithm pattern generator. Therefore, the test apparatus 100 can test the external interface circuit 210 of a device under test 200 operating at higher speeds.

When testing the external interface circuit 210, the interface testing section 110 desirably disconnects the external interface circuit 210 from the internal interface circuit 220.

By doing so, the external interface circuit 210 can be tested in parallel with the internal interface circuit 220 or the internal circuit 230.

The scan testing section 130 sequentially inputs the prescribed logic value pattern to the flip-flops connected in the scan path of the internal interface circuit 220 to perform a scan test. For example, each end of the scan path is connected to a scan pin 204, and the scan testing section 130 may judge the acceptability of the scan path based on the logic value pattern output from one of the scan pins 204 when the prescribed logic value pattern is input to the other scan pin 204.

The BIST testing section 140 tests the internal circuit 230 by controlling the internal self-test circuit 240 via the BIST pin 206. For example, the BIST testing section 140 supplies the internal self-test circuit 240 with a control signal ordering testing of the internal circuit 230. According to this control signal, the internal self-test circuit 240 performs a predetermined measurement or test of the internal circuit 230 and notifies the BIST testing section 140 concerning the result of the measurement or test.

The power supplying section 160 supplies the device under test 200 with the supply power. For example, the power supplying section 160 may supply the device under test 200 with supply power having a constant voltage, or with supply power having a constant current.

The power supply testing section 150 judges the acceptability of the device under test 200 based on a change in the supply power supplied to the device under test 200. For example, the power supply testing section 150 may judge the acceptability of the device under test 200 based on a change in the supply power during a state in which the internal self-test circuit 240 causes the internal circuit 230 to operate. If the power supplying section 160 is supplying supply power with a constant voltage, the power supply testing section 150 may detect a change in the current of the supply power. If the power supplying section 160 is supplying supply power with a constant current, the power supply testing section 150 may detect a change in the voltage of the supply power. The power supply testing section 150 may detect a change in the supply power when the internal circuit 230 is in a rest state.

The result processing section 170 judges the acceptability of the device under test 200 based on the judgment results of the interface testing section 110, the scan testing section 130, the BIST testing section 140, and the power supply testing section 150. For example, the result processing section 170 judges the device under test 200 to be acceptable if no defects are detected in any of the interface testing section 110, the scan testing section 130, the BIST testing section 140, and the power supply testing section 150. If the test apparatus 100 does not perform testing for one or more of the interface testing section 110, the scan testing section 130, the BIST testing section 140, and the power supply testing section 150, the result processing section 170 may judge the acceptability of the device under test 200 based on the test results from whichever of the interface testing section 110, the scan testing section 130, the BIST testing section 140, and the power supply testing section 150 were tested.

As described above, the test apparatus 100 of the present embodiment can test the external interface circuit 210 of a high-speed device under test 200 at a low cost. Furthermore, the test apparatus 100 can perform the testing of the external interface circuit 210 in parallel with another test.

Figure 2:
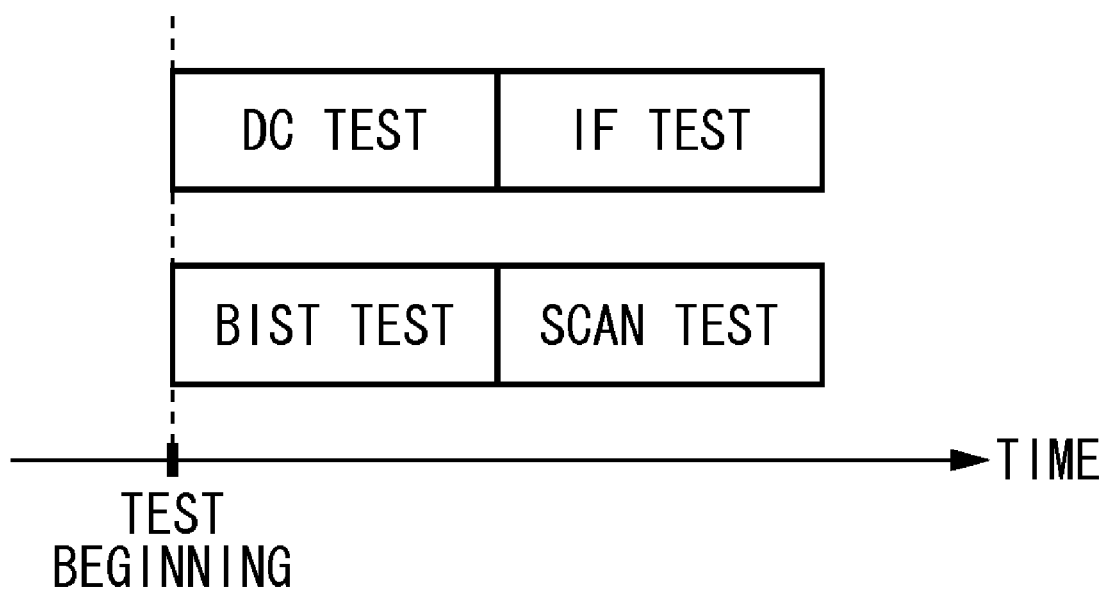
FIG. 2 shows an exemplary operation of the test apparatus 100. As described above, the test apparatus 100 may perform a plurality of different tests in parallel.

FIG. 2 shows an exemplary operation of the test apparatus 100. As described above, the test apparatus 100 may perform a plurality of different tests in parallel. For example, the test apparatus 100 may perform an interface test (IF test) in parallel with another test such as a BIST test. As another example, the test apparatus 100 may perform a power supply tests (DC test) in parallel with the BIST test. In the example shown in FIG. 2, the test apparatus 100 sequentially performs the power supply test (DC test) and the interface test (IF test), and also sequentially performs the BIST tests and a scan test in parallel with these tests. As a result, the test time is shorter than the test time needed to perform these four tests in sequence.

Figure 3:
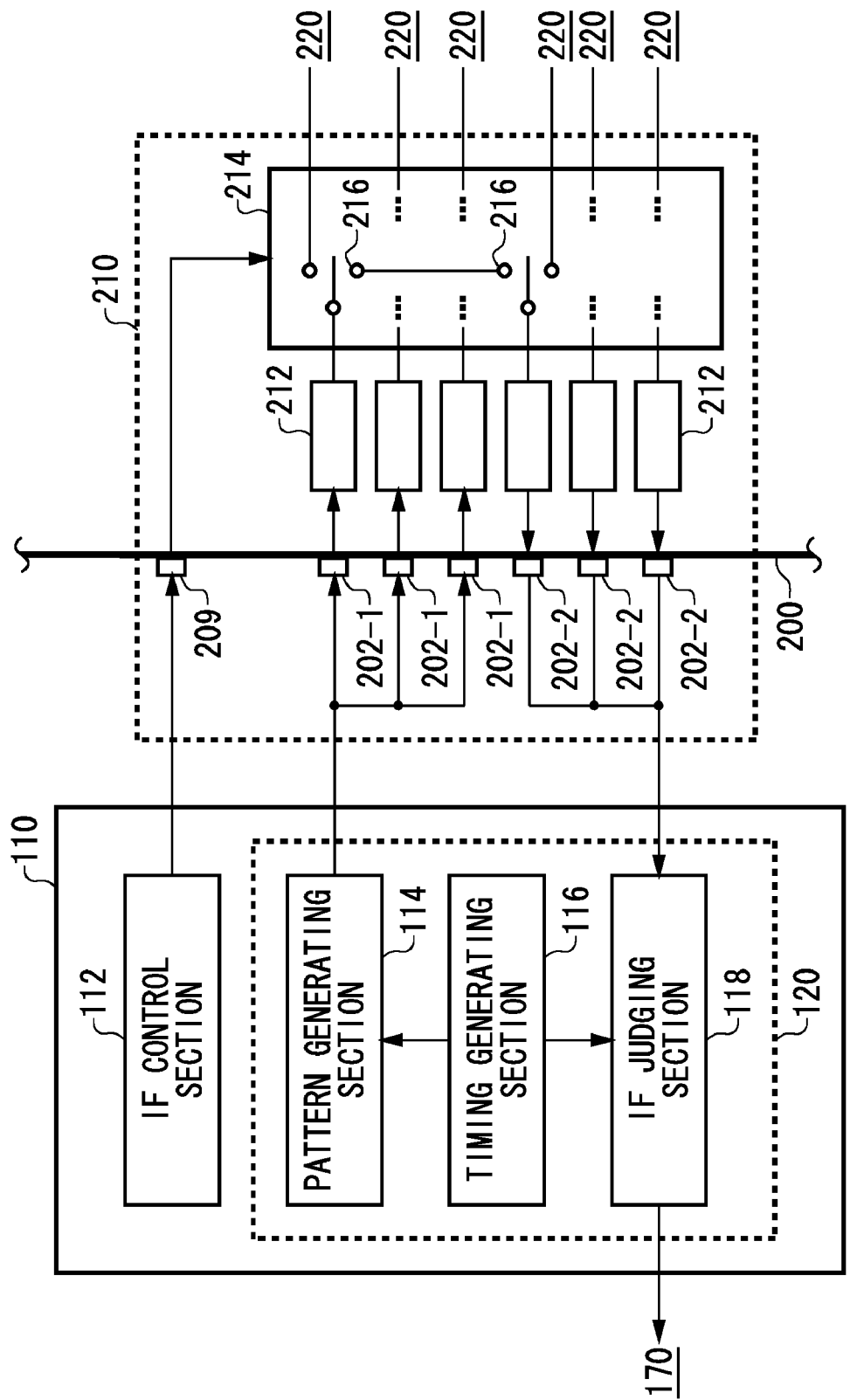
FIG. 3 shows an exemplary configuration of the interface testing section 110 and the external interface circuit 210.

FIG. 3 shows an exemplary configuration of the interface testing section 110 and the external interface circuit 210. The external interface circuit 210 includes the plurality of I/O pins 202, a control pin 209, a plurality of buffer memories 212, and a switching section 214. The plurality of buffer memories 212 are provided to correspond one-to-one with the plurality of I/O pins 202, and each buffer memory 212 is provided between the corresponding I/O pin 202 and the internal interface circuit 220.

Each buffer memory 212 may store data received from the corresponding I/O pin 202, and output this data to the internal interface circuit 220. Each buffer memory 212 may also store data received from the internal interface circuit 220 and output this data to the corresponding I/O pin 202. Instead of the buffer memories 212, the external interface circuit 210 may include buffers that shape the waveform of the signals transferred between the I/O pins 202 and the internal interface circuit 220.

The switching section 214 is provided between the I/O pins 202 and the internal circuit 230. The switching section 214 of the present embodiment is provided between the buffer memories 212 and the internal interface circuit 220. The switching section 214 switches whether each I/O pin 202 is connected to the internal circuit 230 or to another I/O pin 202.

For example, when notification ordering testing of the external interface circuit 210, such as a switching control signal, is received from the external test apparatus 100, the switching section 214 may connect, inside the device under test 200, (i) the I/O pin 202-1 that receives the test pattern from the test apparatus 100 to (ii) the I/O pin 202-2 that loops back and outputs the test pattern to the test apparatus 100. During actual operation of the device under test 200, the switching section 214 may connect the I/O pins 202 to the internal circuit 230.

The switching section 214 of the present embodiment switches whether the buffer memory 212 corresponding to each I/O pin 202 is connected to (i) the internal interface circuit 220 or to (ii) another I/O pin 202 via buffer memory 212. The switching section 214 may include a plurality of switches 216 that correspond one-to-one with the plurality of I/O pins 202.

Each switch 216 switches whether the corresponding buffer memory 212 is connected to the internal interface circuit 220 or to another buffer memory 212. The switching section 214 may be provided between the I/O pins 202 and the buffer memories 212. In this case, each switch 216 switches whether the corresponding I/O pin 202 is connected to the corresponding buffer memory 212 or to another I/O pin 202.

The interface testing section 110 includes an interface control section 112 and an I/O circuit 120. The I/O circuit 120 includes a pattern generating section 114, a timing generating section 116, and an interface judging section 118.

When testing the external interface circuit 210, the interface control section 112 controls the switching section 214 via the control pin 209 to disconnect the connection path transmitting the signal between the external interface circuit 210 and the internal interface circuit 220. The interface control section 112 may connect, in the device under test 200, (i) the I/O pin 202-1 that receives the test pattern from the pattern generating section 114 to (ii) the I/O pin 202-2 that loops back and outputs the test pattern. The interface control section 112 may supply the switching section 214 with a switching control signal that controls the switching section 214, via the control pin 209.

For example, the interface control section 112 may control each switch 216 in the switching section 214 such that half of the I/O pins, i.e. the I/O pins 202-1, are connected one-to-one to the other half of the I/O pins, i.e. the I/O pins 202-2 via the switches 216. The interface control section 112 may control the switching section 214 such that the data stored by the buffer memories 212 corresponding to the I/O pins 202-1 is output from the I/O pins 202-2.

The pattern generating section 114 inputs a test pattern to each I/O pin 202-1 to test the external interface circuit 210. As a result of the interface control section 112 controlling the switching section 214 in the manner described above, the external interface circuit 210 can loop back the input test pattern to output the looped test pattern from the I/O pins 202-2. In other words, the interface control section 112 can cause the external interface circuit 210 to loop the test pattern input from the test apparatus 100 back to the test apparatus 100.

The pattern generating section 114 may generate a test pattern using a simple process, such as a test pattern having a pseudorandom pattern or a test pattern having pulses at a constant period. As a result, the pattern generating section 114 can generate a test pattern having a high frequency. Therefore, the test apparatus 100 can test the external interface circuit 210 of the device under test 200 that operates at a high speed.

The interface judging section 118 judges the acceptability of the external interface circuit 210 based on the test pattern that is looped back and output by the external interface circuit 210 through the I/O pins 202-2. For example, the interface judging section 118 may detect the logic value of the signal output by the external interface circuit 210, according to a timing signal supplied thereto, and judge the acceptability of the external interface circuit 210 by comparing the detected logic value pattern to the predetermined expected value pattern.

The timing generating section 116 supplies timing signals to the pattern generating section 114 and the interface judging section 118. For example, the timing generating section 116 may supply the pattern generating section 114 with a timing signal that determines the transition timing of the logic value of the test pattern, and may supply the interface judging section 118 with a timing signal having a an opening positioned in the substantial temporal center of each data bit of the signal output by the external interface circuit 210.

The timing generating section 116 may apply jitter to the timing signal supplied to the pattern generating section 114. In this case, jitter is applied to the test pattern output by the pattern generating section 114, and so a jitter test can be performed on the external interface circuit 210.

For example, the timing generating section 116 may gradually change the amplitude of the jitter applied to the timing signal. The interface judging section 118 may then judge whether the logic value pattern of the signal output by the external interface circuit 210 matches the expected value pattern at each jitter amplitude. In this way, the test apparatus 100 can determine the jitter tolerance of the external interface circuit 210.

The interface judging section 118 may measure the amplitude of the jitter in the signal output by the external interface circuit 210. In this case, the timing generating section 116 may generate a plurality of timing signals that have different phases for each cycle of the signal output by the external interface circuit 210. In each cycle of the signal, the interface judging section 118 may calculate the jitter output by the external interface circuit 210 based on the deviation in the phase of the timing signal that detects the logic value transition. The test apparatus 100 may calculate the jitter gain of the external interface circuit 210 based on the ratio between (i) the jitter amplitude applied to the timing signal that is supplied to the pattern generating section 114 and (ii) the jitter amplitude measured by the interface judging section 118.

The pattern generating section 114 may generate a test pattern having a logic value fixed at H or L. The test apparatus 100 may detect signal level loss in the external interface circuit 210 based on the level of the signal input to the external interface circuit 210 and the level of the signal output by the external interface circuit 210.

FIG. 3 shows a common I/O circuit 120 provided to the plurality of I/O pins 202, but the interface testing section 110 may instead include a plurality of I/O circuits 120 corresponding one-to-one with the plurality of I/O pins 202. In this case, the pattern generating sections 114 of the I/O circuits 120 corresponding to the I/O pins 202-1 that receive the test pattern input the test pattern to these corresponding I/O pins 202-1. The interface judging sections 118 of the I/O circuits 120 corresponding to the I/O pins 202-2 that loop back and output the test pattern measure the signal output by these corresponding I/O pins 202-2.

Figure 4:
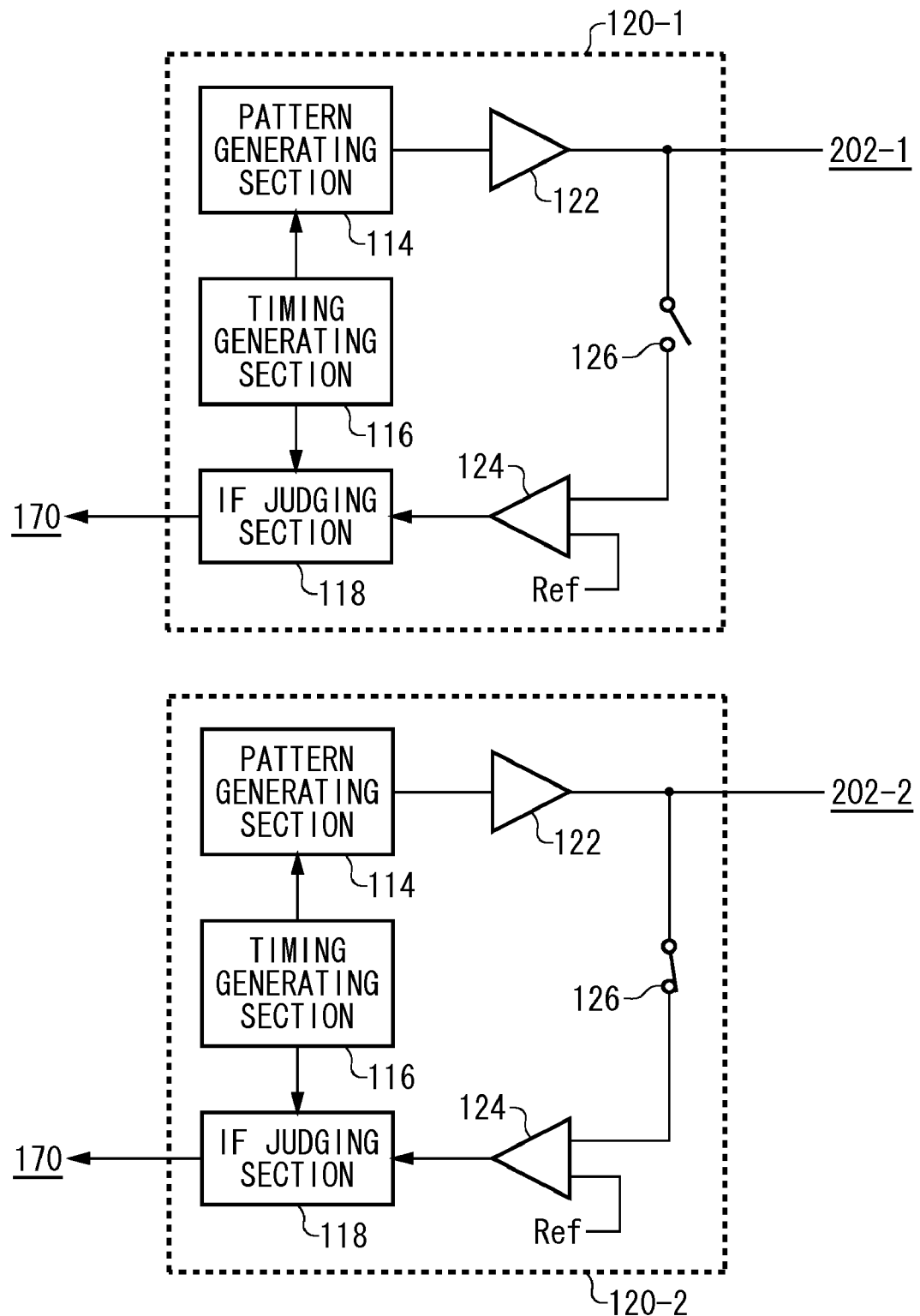
FIG. 4 shows an exemplary configuration of a plurality of I/O circuits 120 corresponding one-to-one to a plurality of I/O pins 202.

FIG. 4 shows an exemplary configuration of a plurality of I/O circuits 120 corresponding one-to-one to a plurality of I/O pins 202. FIG. 4 shows an I/O circuit 120-1 corresponding to an I/O pin 202-1 and an I/O circuit 120-2 corresponding to an I/O pin 202-2, but the interface testing section 110 may include a plurality of I/O circuits 120-1 corresponding to a plurality of I/O pins 202-1 and a plurality of I/O circuits 120-2 corresponding to a plurality of I/O pins 202-2.

The I/O circuits 120-1 and 120-2 of the present embodiment each include a driver 122, a comparator 124, and a switch 126 in addition to the configuration of the I/O circuit 120 described in relation to FIG. 3. The driver 122 creates a signal according to the test pattern output by the pattern generating section 114, and supplies this signal to the I/O pin 202. For example, the driver 122 is supplied with a voltage that is to be output when the test pattern indicates logic H and a voltage that is to be output when the test pattern indicates logic L, and outputs a voltage waveform corresponding to the logic value pattern of the test pattern in this manner.

The comparator 124 receives the signal output by the I/O pin 202, compares the level of the received signal to a predetermined reference level, and supplies the interface judging section 118 with the comparison result. For example, the comparator 124 may output logic H when the level of the received signal is greater than the reference level, and may output logic L when the level of the received signal is less than or equal to the reference level. The interface judging section 118 acquires the comparison result from the comparator 124 according to the timing signal supplied from the timing generating section 116, thereby acquiring the logic value pattern of the signal output by the I/O pin 202, and compares this logic value pattern to the expected value pattern.

The switch 126 switches whether or not the input end of the comparator 124 is connected to the I/O pin 202. The switch 126 of the present embodiment is provided between (i) the line connecting the driver 122 and the I/O pin 202 and (ii) the input end of the comparator 124, and switches whether or not the input end of the comparator 124 is connected to this line.

When the I/O circuit 120 is connected to an I/O pin 202-1 that receives the test pattern, the switch 126 disconnects the comparator 124 from the I/O pin 202-1, thereby causing the I/O pin 202-1 to be supplied with the signal output by the driver 122. When the I/O circuit 120 is connected to an I/O pin 202-2 that loops back and outputs the test pattern, the switch 126 connects the comparator 124 to the I/O pin 202-2, thereby causing the comparator 124 to be supplied with the signal output by the I/O pin 202-2.

In the present embodiment, the switch 126 of the I/O circuit 120-1 disconnects the comparator 124 from the I/O pin 202-1. The pattern generating section 114 of the I/O circuit 120-1 outputs the test pattern.

The switch 126 of the I/O circuit 120-2 connects the comparator 124 to the I/O pin 202-2. The driver 122 of the I/O circuit 120-2 does not output the test pattern, and the comparator 124 measures the test pattern looped back and output from the I/O pin 202-2.

Figure 5A:
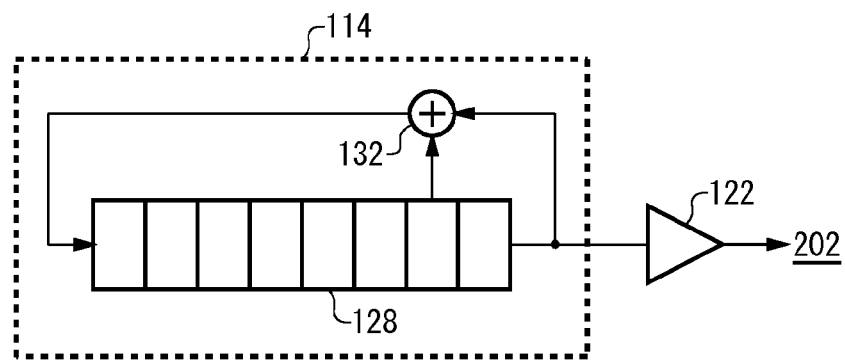
FIG. 5A shows an exemplary configuration of the pattern generating section 114.
Figure 5B:
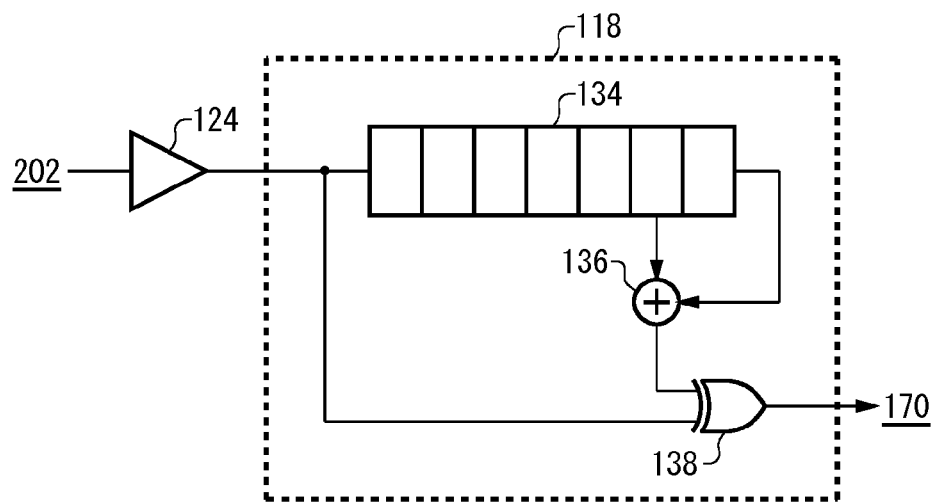
FIG. 5B shows an exemplary configuration of the interface judging section 118.

FIGS. 5A and 5B show exemplary configurations of the pattern generating section 114 and the interface judging section 118. FIG. 5A shows an exemplary configuration of the pattern generating section 114. FIG. 5B shows an exemplary configuration of the interface judging section 118.

The pattern generating section 114 includes a shift register 128 and an adding section 132, and generates a pseudorandom pattern as the test pattern. The shift register 128 includes a plurality of registers connected in cascade. The timing signal generated by the timing generating section 116 may be branched and supplied to each register. Each register acquires and stores the logic value output by the register at the previous stage, according to the timing signal supplied thereto, and outputs the stored logic value.

The adding section 132 adds together the plurality of logic values output by the plurality of registers, and inputs the result to the register at the first stage. The adding section 132 of the present embodiment adds together (i) the logic value output by the register at the final stage and (ii) the logic value output by the register at the stage immediately before the final stage, and inputs the result to the register at the first stage. Here, the addition performed by the adding section 132 may be a process for obtaining the logical sum. With this configuration, the pattern generating section 114 can generate a pseudorandom pattern that depends on the initial value stored by each register and which of the registers has its output logic value added by the adding section 132.

At least one of the registers stores logic H as the initial value, and at least one of the registers stores logic L as the initial value. The adding section 132 may add together the logic values output by three or more of the registers, and input the resulting logical sum to the register at the first stage.

The pattern generating section 114 may further include an initial setting section that sets the initial values stored in the registers according to the pseudorandom pattern to be generated. The pattern generating section 114 may further include a selecting section that controls whether the output of each register is input to the adding section 132, according to the pseudorandom pattern to be generated. The pattern generating section 114 may further include a stage control section that controls the number of stages in the shift register 128 according to the pseudorandom pattern to be generated. For example, the stage control section may adjust the number of stages in the shift register 128 by selecting which register's output is input to the driver 122. In this case, it is desirable that the adding section 132 not be connected to any registers that are at a later stage than the register connected to the driver 122.

With this configuration, the pattern generating section 114 can generate many types of pseudorandom patterns using a simple configuration. Since complicated calculations are unnecessary, the pattern generating section 114 can generate a test pattern with a high frequency.

The interface judging section 118 determines whether the test pattern output by the pattern generating section 114 matches the logic value pattern looped back and output by the external interface circuit 210. The interface judging section 118 of the present embodiment determines whether the logic value pattern detected by the comparator 124 matches the pseudorandom pattern generated by the pattern generating section 114.

The test pattern generated by the pattern generating section 114 is determined according to the configuration of the shift register 128 and the adding section 132 and the initial values stored in the registers of the shift register 128. The interface judging section 118 of the present embodiment includes circuits having the same configuration as the shift register 128 and the adding section 132 of the pattern generating section 114, and can therefore reproduce the test pattern generated by the pattern generating section 114 and compare this test pattern to the logic value pattern detected by the comparator 124.

The interface judging section 118 includes a shift register 134, an adding section 136, and a match detecting section 138. The shift register 134 and the adding section 136 may have the same configuration as the shift register 128 and the adding section 132 of the pattern generating section 114. In other words, the shift register 134 may have the same number of stages of registers as the shift register 128. However, it should be noted that the logic values output by the comparator 124 are sequentially input to the register at the first stage of the shift register 134. Furthermore, each register in the shift register 134 may be provided with a clock signal having the same period as the clock signal supplied to the registers of the shift register 128.

The adding section 136 may be connected to a register in the shift register 134 that corresponds to the register in the shift register 128 to which the adding section 132 is connected. However, it should be noted that the calculation result of the adding section 136 in the interface judging section 118 is input to the match detecting section 138 and not to the register at the first stage in the shift register 134.

The match detecting section 138 detects whether the logic value acquired from the adding section 136 matches the logic value input to the register at the first stage in the shift register 134. The match detecting section 138 may be an exclusive OR circuit, for example.

When the logic value output by the comparator 124 is sequentially input to the shift register 134 and all of the initial values stored by the shift registers are pushed out, the logic value output by the adding section 136 indicates the logic value that is to be input to the shift register 134 next. In other words, after all of the initial values stored by the shift registers in the shift register 134 are pushed out so that the logic value pattern already input to the shift register 134 matches the pseudorandom pattern generated by the pattern generating section 114, the logic value output by the adding section 136 matches the next logic value in the pseudorandom pattern generated by the pattern generating section 114.

Therefore, by comparing the logic value input to the shift register 134 and the logic value output by the adding section 136, the test apparatus 100 can judge whether the external interface circuit 210 is operating correctly. In other words, the test apparatus 100 can determine whether the external interface circuit 210 outputs a logic value pattern that is the same as the test pattern input thereto.

With this configuration, when a pseudorandom pattern is used as the test pattern, the expected value pattern can be generated easily. Furthermore, since the test pattern is generated using the same configuration as the pattern generating section 114, the expected value pattern can be generated with the same operational speed achieved by the pattern generating section 114. Yet further, since the logic values input to the shift register 134 are in synchronization with the logic values output by the adding section 136, the logic value patterns can be compared without regard to a transmission delay amount or the like in the external interface circuit 210.

For example, if the test pattern output by the pattern generating section 114 is branched and input to the interface judging section 118 and this test pattern is used as the expected value pattern, the phase of the expected value pattern is shifted according to the transmission delay amount in the external interface circuit 210 or the like, and this shifted expected value pattern is compared to the logic value pattern. On the other hand, in the interface judging section 118 of the present embodiment, the logic value to be input, i.e. the expected value, is generated based on the logic value pattern that has already been input, and so the expected value pattern can be generated in synchronization with the input logic value pattern. As a result, the logic value pattern and the expected value pattern can be compared without regard to the transmission delay amount or the like.

Figure 6:
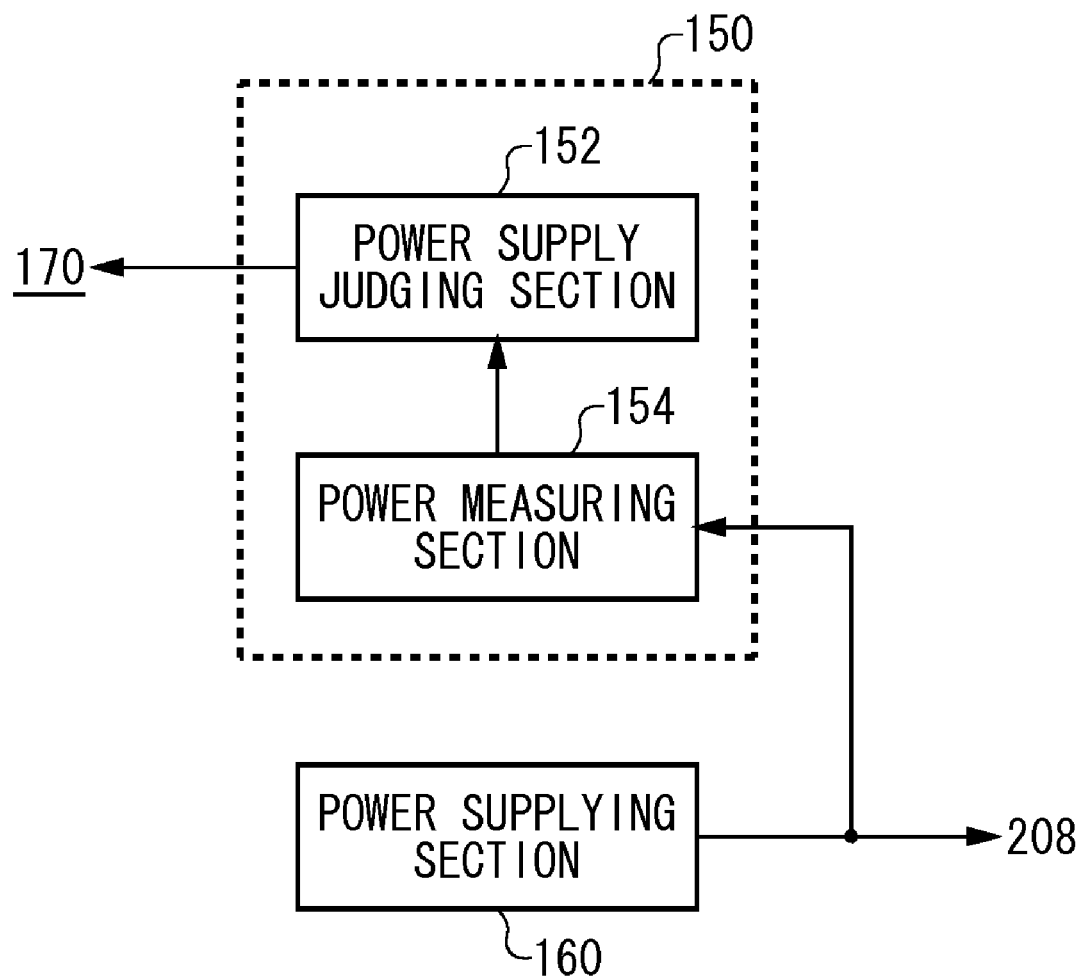
FIG. 6 shows an exemplary configuration of the power supply testing section 150.
Figure 7:
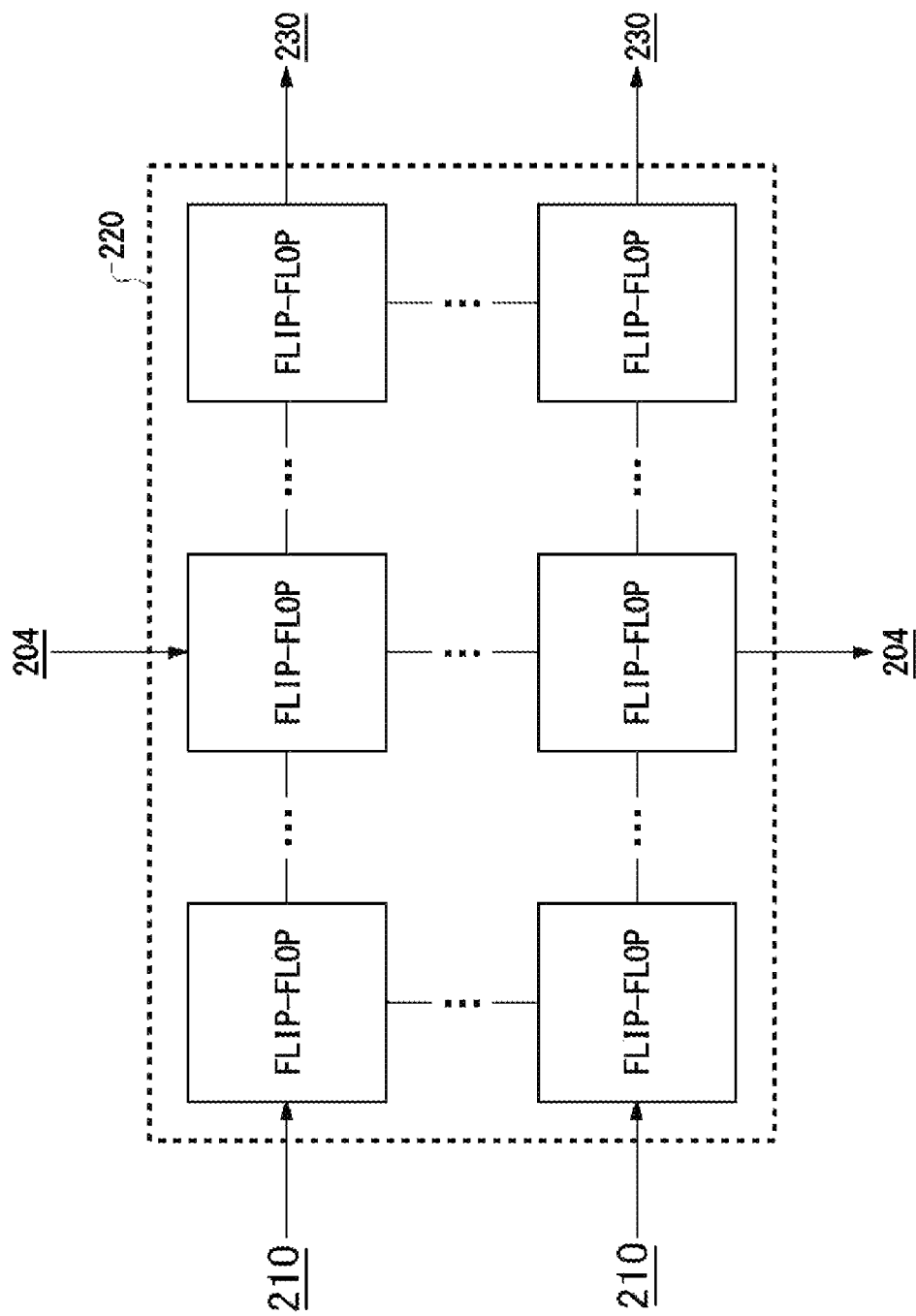
FIG. 7 shows an exemplary configuration of the internal interface circuit 220.

FIG. 6 shows an exemplary configuration of the power supply testing section 150. The power supply testing section 150 includes a power supply judging section 152 and a power measuring section 154. The power measuring section 154 measures the supply power supplied from the power supplying section 160 to the device under test 200. The power supplying section 160 may supply the device under test 200 with the supply power in parallel with the testing of the internal circuit 230. The power measuring section 154 may measure the power supply voltage or the power supply current, as described above.

The power supply judging section 152 judges the acceptability of the device under test 200 based on the supply power measured by the power measuring section 154. For example, the power supply judging section 152 may judge the acceptability of the device under test 200 based on whether the power supply voltage or the power supply current measured by the power measuring section 154 falls within a predetermined range.

The power supply testing section 150 may perform the tests described above in parallel with the test of the internal circuit 230 or the scan test. The power supply testing section 150 may perform the tests described above in parallel with the test of the external interface circuit 210.

As described above, the test apparatus 100 according to an embodiment of the present invention can test the external interface circuit 210 of a device under test 200 that operates at high-speed, and can be realized at a low cost. Furthermore, when testing the external interface circuit 210, the test apparatus 100 disconnects the external interface circuit 210 from the internal circuit 230, so that testing of the external interface circuit 210 can be performed in parallel with testing of the internal circuit 230. For example, by using an internal self-test circuit 240 to test the internal circuit 230, the test apparatus 100 can perform testing of the external interface circuit 210 and testing of the internal circuit 230 in parallel, thereby decreasing the testing time.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the present invention can test an external interface circuit of a device under test that operates at high-speed, and can be realized at a low cost. Furthermore, when testing the external interface circuit, the present invention disconnects the external interface circuit from the internal circuit, so that testing of the external interface circuit can be performed in parallel with testing of the internal circuit. For example, by using an internal self-test circuit to test the internal circuit, the present invention can perform testing of the external interface circuit and testing of the internal circuit in parallel, thereby decreasing the testing time.

What is claimed is:

1. A test apparatus configured to connect to, via an I/O pin, and test, via the I/O pin, a device under test that is external to the test apparatus and includes an external interface circuit that transfers signals between an internal circuit inside the device under test and the outside of the device under test, the test apparatus comprising:
   a pattern generating section that inputs, to the external interface circuit, a test pattern for testing the external interface circuit;
   an interface control section that causes the external interface circuit to loop back and output the test pattern; and
   an interface judging section that judges acceptability of the external interface circuit based on the test pattern looped back and output by the external interface circuit.

2. The test apparatus according to claim 1, wherein
   the external interface circuit includes a plurality of I/O pins, and
   during testing of the external interface circuit, the interface control section connects, within the device under test, (i) I/O pins, from among the plurality of I/O pins, into which the test pattern is input by the pattern generating section to (ii) I/O pins, from among the plurality of I/O pins, that loop back and output the test pattern.

3. The test apparatus according to claim 1, wherein
   the device under test further includes an internal self-test circuit that tests the internal circuit, and
   the test apparatus further includes:
     a BIST testing section that controls the internal self-test circuit to test the internal circuit; and
     a result processing section that judges the device under test to be acceptable when no defects are found in the internal circuit and the external interface circuit.

4. The test apparatus according to claim 3, wherein
   the BIST testing section tests the internal circuit in parallel with a test of the external interface circuit.

5. The test apparatus according to claim 4, wherein
   during testing of the external interface circuit, the interface control section disconnects a connection path transmitting signals between the external interface circuit and the internal circuit.

6. The test apparatus according to claim 1, further comprising:

a power supplying section that, in parallel with a test of the internal circuit, supplies the internal circuit with supply power;

a power measuring section that measures the supply power supplied from the power supplying section to the device under test; and a power supply judging section that judges acceptability of the device under test based on the supply power measured by the power measuring section.

7. The test apparatus according to claim 1, wherein the pattern generating section generates a pseudorandom pattern as the test pattern, and the interface judging section determines whether the pseudorandom pattern output by the pattern generating section matches a logic value pattern looped back and output by the external interface circuit.

8. The test apparatus according to claim 2, wherein the external interface circuit includes a plurality of buffer memories that correspond one-to-one with the plurality of I/O pins and that each store data that is input from the outside to the corresponding I/O pin, and during testing of the external interface circuit, the interface control section outputs, via the I/O pins that loop back and output the test pattern, the data stored by the buffer memories corresponding to the I/O pins into which the test pattern is input.

9. The test apparatus according to claim 2, wherein the external interface circuit includes a switching section that switches whether each I/O pin is connected to the internal circuit or to another I/O pin, and during testing of the external interface circuit, the interface control section inputs, to the switching section, a switching control signal that causes (i) the I/O pins into which the test pattern is input from the pattern generating section to be connected to (ii) the I/O pins from which the test pattern is to be looped back and output.

10. An electronic device comprising:

an internal circuit;

an external interface circuit that includes a plurality of I/O pins and that transfers signals between the internal circuit and the outside of the device;

an internal interface circuit that is provided coupled between the internal circuit and the external interface circuit; and a switching section that switches whether each I/O pin is connected to the internal interface circuit or to another I/O pin, wherein when notification for testing of the external interface circuit is received from an external test apparatus, the switching section connects, within the external interface circuit, via a path not including the internal interface circuit and not including the internal circuit, (i) I/O pins, from among the plurality of I/O pins, that receive a test pattern from the test apparatus to be connected to (ii) I/O pins, from among the plurality of I/O pins, that loop back and output the test pattern to the test apparatus.

11. The electronic device according to claim 10, further comprising an internal self-test circuit that tests the internal circuit, wherein when the internal circuit and the external interface circuit are tested in parallel, the switching section disconnects the external interface circuit from the internal circuit.

12. The electronic device according to claim 10, wherein the internal circuit includes a memory cell for storing input data.

13. The test apparatus according to claim 7, wherein the pattern generating section includes a shift register and an adding section, the shift register including a plurality of registers connected in cascade, each of the plurality of registers acquires and stores a logic value output by the register at the previous stage, according to a supplied timing signal, and outputs the stored logic value, and the adding section adds together logic values output by the plurality of registers, and inputs the result to the register at the first stage.

14. The electronic device according to claim 10, wherein the internal interface circuit includes a flip-flop connected to a scan pin via a path not including the external interface circuit.

* * * * *